US006867624B2

United States Patent
Wang

(10) Patent No.: US 6,867,624 B2
(45) Date of Patent: Mar. 15, 2005

(54) CIRCUIT FOR VOLTAGE LEVEL DETECTION

(75) Inventor: Zhenhua Wang, Zürich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 33 days.

(21) Appl. No.: 09/761,253

(22) Filed: Jan. 16, 2001

(65) Prior Publication Data

US 2001/0013799 A1 Aug. 16, 2001

(30) Foreign Application Priority Data

Jan. 19, 2000 (EP) ............................................. 00200205

(51) Int. Cl.[7] .......................... H03K 5/22; H03K 5/153
(52) U.S. Cl. ........................ 327/81; 327/143; 327/206; 327/198
(58) Field of Search .............................. 327/80–81, 143, 327/198, 66–68, 77, 103, 72–74, 205, 206

(56) References Cited

U.S. PATENT DOCUMENTS

| 4,506,168 A | | 3/1985 | Uya ............................ 327/206 |
| 4,529,891 A | | 7/1985 | Oida ........................... 307/355 |
| 5,319,255 A | * | 6/1994 | Garverick et al. ........... 327/143 |
| 5,319,265 A | | 6/1994 | Lim ............................. 327/73 |
| 5,652,540 A | | 7/1997 | Eilley ........................... 327/77 |
| 5,744,998 A | | 4/1998 | Ito et al. ....................... 327/537 |
| 5,760,614 A | | 6/1998 | Ooishi et al. .................. 327/77 |
| 5,847,586 A | * | 12/1998 | Burstein et al. ............. 327/143 |
| 5,872,479 A | * | 2/1999 | Shin ............................ 327/534 |
| 5,966,330 A | | 10/1999 | Tang et al. ............... 365/185.2 |
| 6,037,890 A | | 3/2000 | Glass et al. .................. 341/159 |
| 6,091,283 A | | 7/2000 | Murgula et al. ............. 327/537 |
| 6,166,526 A | | 12/2000 | Greitschus .................... 327/534 |
| 6,184,724 B1 | * | 2/2001 | Lin .............................. 327/143 |
| 6,259,286 B1 | | 7/2001 | Papaliolios .................. 327/143 |
| 6,285,223 B1 | * | 9/2001 | Smith .......................... 327/143 |
| 6,377,090 B1 | * | 4/2002 | Bruno .......................... 327/143 |

FOREIGN PATENT DOCUMENTS

EP 0433696 A2 6/1991 ......... G01R/19/165

OTHER PUBLICATIONS

Patent Abstracts of Japan, vol. 6, No. 075, May 12, 1982.
Patent Abstracts of Japan, 1998, No. 1, Jan. 30, 1998.

* cited by examiner

Primary Examiner—Quan Tra

(57) ABSTRACT

A voltage level detection circuit (1) with a threshold level, which is dependent on the manufacturing process. The circuit comprises a first current generator (4), which generates a monitoring current ($I_M$) derived from the voltage ($V_M$) to be monitored. This monitoring current ($I_M$) is compared with a reference current ($I_{ref1}$). A switchable reference current ($I_{ref2}$) provides for hysteresis. The first current generator (4) comprises an element, the resistance of which depends on the manufacturing process.

23 Claims, 4 Drawing Sheets

CIRCUIT FOR VOLTAGE LEVEL DETECTION

BACKGROUND OF THE INVENTION

1. Field of the Invention

The present invention relates in general to monitoring a voltage level at a specified detection point such as a pin of an integrated circuit. More particularly, the present invention relates to monitoring the supply voltage of an integrated circuit, and to inhibit such integrated circuit during power up. However, the present invention is not limited to application in integrated circuits. Further, the present invention is not limited to monitoring a supply voltage, but the present invention can be utilized for monitoring any voltage level. In the following, however, the present invention will be explained in the context of a power-up situation of an integrated circuit.

2. Description of the Related Art

When an electronic circuit such as an integrated circuit is initiated or powered-up, i.e. that the supply voltage to such circuit is switched on, the supply voltage will rise from zero to an operational supply voltage within a certain amount of time. During a first stage of the rising of the supply voltage, the supply voltage will be less than a certain minimum voltage at which the circuit is designed to function properly. The functioning of the circuit for a supply voltage below such minimum voltage is undefined; therefore, it is desirable to inhibit any functioning of the circuit until the supply voltage reaches such minimum voltage. Further, it is desirable to assure that the components of the integrated circuit are in a well-defined initial state when the circuit starts to function. Therefore, in general there is a need for a voltage detection circuit generating a signal that is indicative for whether or not the voltage at a detection point has reached a certain threshold level. The output signal generated by such circuit can be applied to other circuitry for inhibiting the functioning thereof.

Such voltage detection circuits are known per se. For instance, EP-A-0.433.696 discloses a voltage detection circuit comprising a load for creating a voltage drop and generating a reduced voltage, which is compared with a reference voltage. An output voltage is HIGH as long as the voltage to be detected is lower than a trip point. When the voltage to be detected exceeds such trip point, the output voltage becomes LOW. For obtaining a desired amount of hysteresis, a feedback signal which is associated with the output voltage controls a switch which shorts at least part of said load in order to reduce said voltage drop and to increase said reduced voltage.

A general disadvantage of conventional supply voltage detection circuits is that the threshold level is fixed and predefined. As a consequence, in view of the fact that in practice the threshold levels in individual chips will show a certain spread, such fixed threshold level must be chosen well above the minimum supply voltage necessary for a correct functioning of the chip. This means that a valid supply voltage range is relatively small.

Further, it is considered a disadvantage that the prior art circuitry operates on voltage signals. A circuit for summing or subtracting signals is relatively complicated when implemented in voltage domain, and will consume relatively much power which results in relatively fast exhaustion of a battery.

SUMMARY OF THE INVENTION

A general objective of the present invention is to provide a voltage level detection circuit without the above-mentioned disadvantages.

More particularly, it is an objective of the present invention to provide a voltage level detection circuit where the threshold level for each chip can be set and individually adjusted after manufacturing the chip.

Further, it is an objective of the present invention to provide a voltage level detection circuit where the threshold level is depending on the manufacturing process of the individual chip.

Further, it is an objective of the present invention to provide a voltage level detection circuit having only a very small power consumption, especially after power-up.

These and other aspects, characteristics and advantages of the present invention will be further clarified by the following description of a preferred embodiment of a power-on-reset circuit in accordance with the invention.

DETAILED DESCRIPTION OF THE INVENTION

Figure 1:
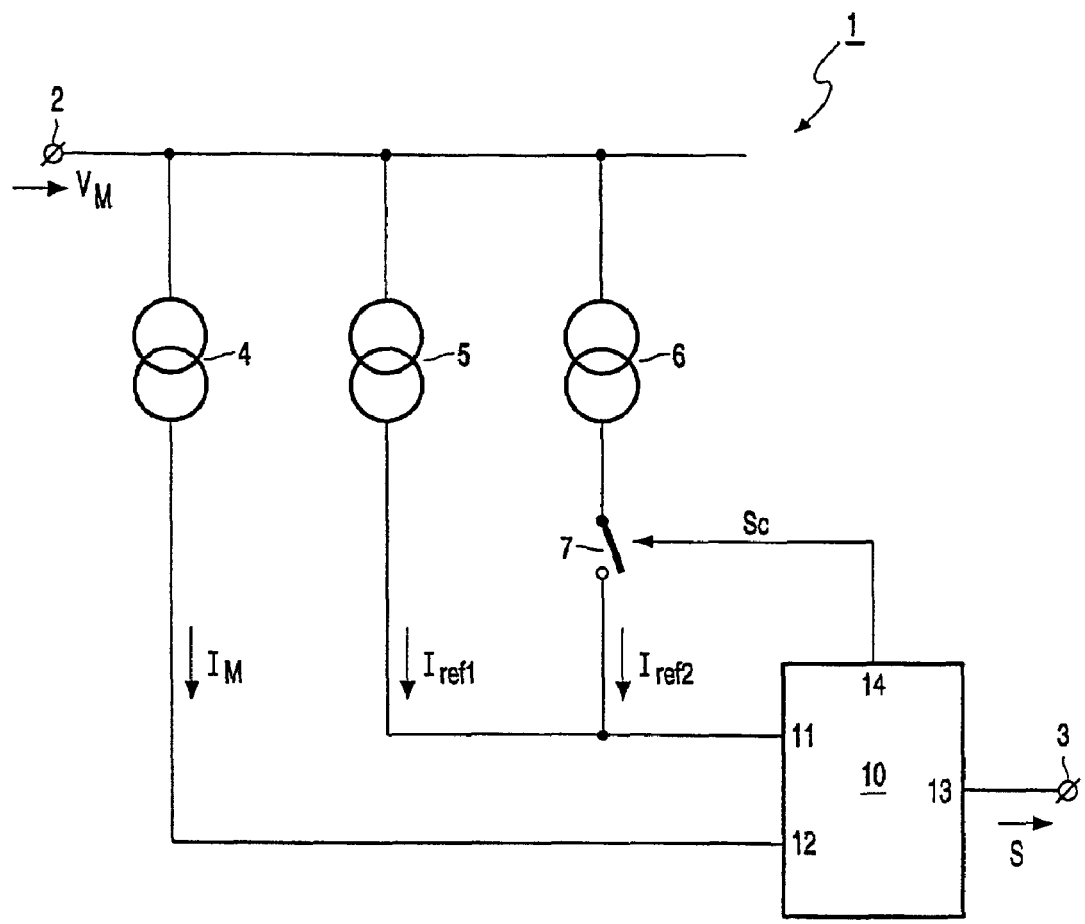
FIG. 1 is a block diagram illustrating the functioning of an adaptive power-on-reset (POR) circuit according to the present invention.

FIG. 1 is a block diagram of an adaptive power-on-reset (POR) circuit 1, illustrating the basic principles of the present invention.

The POR circuit 1 has a monitoring input 2 for receiving a voltage $V_M$ to be monitored. The POR circuit 1 comprises three current sources 4, 5, 6, and a current comparator 10, having two current inputs 11 and 12, a signal output 13, and a control output 14.

A first current source 4 generates a monitoring current $I_M$ that is representative for the voltage $V_M$ to be monitored; preferably, the monitoring current $I_M$ is proportional to the voltage $V_M$ to be monitored, or at least the characteristic of $I_M$ as a function of $V_M$ is monotonic. The monitoring current $I_M$ is input into the second current input 12 of the current comparator.

A second current source 5 generates a first reference current $I_{ref1}$. Preferably, the first reference current $I_{ref1}$ is constant. The second current source 5 may receive its power from a separate power line, but it is also possible that the second current source 5 receives its power from the voltage $V_M$ to be monitored, as shown. The first reference current $I_{ref1}$ is input into the first current input 11 of the current comparator.

A third current source 6 generates a second reference current $I_{ref2}$. Preferably, the second reference current $I_{ref2}$ is constant. The third current source 6 may receive its power from a separate power line, but it is also possible that the third current source 6 receives its power from the voltage $V_M$ to be monitored, as shown. The third current source 6 is a controllable current source which has its output coupled to the first current input 11 of the current comparator 10 through a controllable switch 7, which is controlled by a control signal Sc generated by the comparator 10 at its control output 14. Thus, the occurrence of the second reference current $I_{ref2}$ is controlled by the control signal Sc. As an alternative, the third current source 6 itself may be a controllable current source.

The comparator 10 generates an output signal S at its output 13, which is coupled to the output 3 of the circuit 1.

The comparator 10 is adapted to compare the currents received at its two inputs 11 and 12, and to generate the output signal S and the control signal Sc depending on the result. If the magnitude of the current at its first input 11 is higher than the magnitude of the current at its second input 12, the output signal of the current comparator 10 has a first value, and the control signal Sc has a switch closing value. If the magnitude of the current at its first input 11 is less than the magnitude of the current at its second input 12, the output signal of the current comparator 10 has a second value differing from the first value, and the control signal Sc has a switch opening value. Preferably, the output signal S is a voltage signal, and the first value is HIGH while the second value is LOW so that the output signal S is directly applicable as inhibit signal for integrated circuits, which usually expect an inhibit signal HIGH. Further, preferably, the controllable switch 7 is of such type that the switch closing value of the control signal Sc is LOW while the switch opening value is HIGH.

The operation of the circuit 1 is as follows. As long as the voltage $V_M$ to be monitored is relatively low, the monitoring current $I_M$ from the first current source 4 will be lower than the first reference current $I_{ref1}$ from the second current source 5. Then, the output signal S of the current comparator 10 will have the first value (HIGH). Further, the control signal Sc from the current comparator 10 will be such (LOW) that the controllable switch 7 is closed (conductive state); hence, the current comparator 10 receives a current $I_{ref1}+I_{ref2}$ at its first input 11.

If $V_M$ rises such that the monitoring current $I_M$ from the first current source 4 will be higher than the combined currents $I_{ref1}+I_{ref2}$ at the first input 11, the output signal S of the current comparator 10 will have the second value (LOW). In other words, the output signal S of the comparator 10 will switch from first value to second value when $I_M$ passes a first threshold level $I_{TH1}=I_{ref1}+I_{ref2}$ in a rising direction. Further, the control signal Sc from the current comparator 10 will be such (HIGH) that the controllable switch 7 is opened (non-conductive state); hence, the current comparator 10 now receives only the first reference current $I_{ref1}$ at its first input 11. Consequently, the output signal S of the comparator 10 will switch back from second value to first value only when $I_M$ passes a second threshold level $I_{TH2}=I_{ref1}$ in a downward direction.

The first threshold level $I_{TH1}$ corresponds to a $V_{DD}$ level at which a POR signal is expected. The difference $I_{TH1}-I_{TH2}=I_{ref2}$ consitutes a hysteresis of the circuit 1. Normally, such hysteresis is desirable for proper operation. However, if no hysteresis is necessary or desired, the third current source 6 and the controllable switch 7 may be omitted, and the comparator 10 does not need to provide a control signal Sc.

Figure 2:
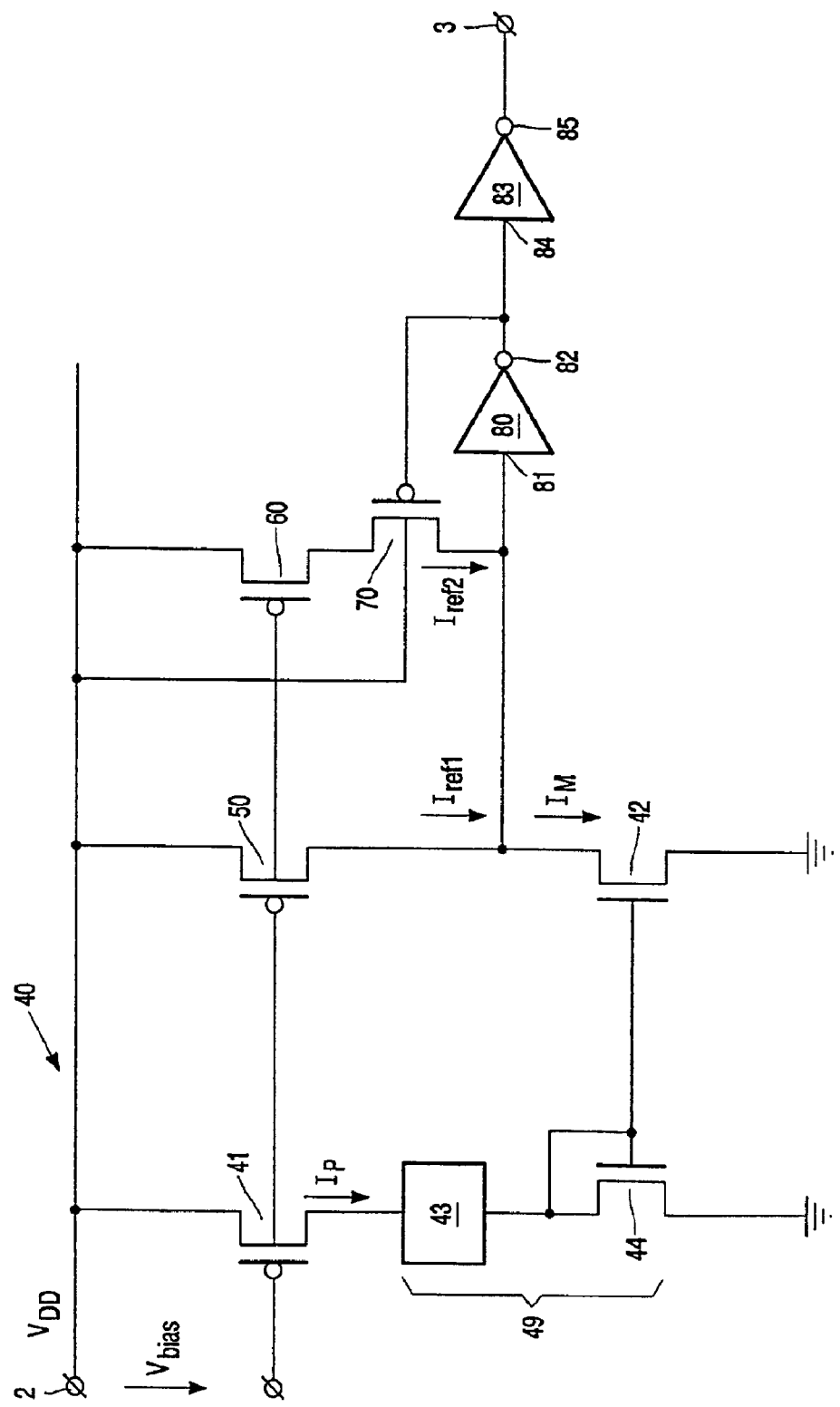
FIG. 2 illustrates in more detail a preferred embodiment of the POR circuit according to the present invention.

FIG. 2 illustrates in more detail a preferred embodiment of the POR circuit 1. In this embodiment, the voltage to be monitored is the power supply line $V_{DD}$. The second current source 5 is implemented as a second PMOS transistor 50 having its source connected to the power supply line $V_{DD}$ and having its drain connected to an input 81 of a first inverter 80. The third current source 6 is implemented as a third PMOS transistor 60 having its source connected to the power supply line $V_{DD}$. The controllable switch 7 is implemented as a fourth PMOS transistor 70 having its source connected to the drain of transistor 60 and having its drain connected to the input 81 of the first inverter 80. The gate of transistor 70 is connected to the output 82 of the first inverter 80. The POR circuit 1 of FIG. 2 further comprises a second inverter 83 having an input 84 and an output 85. The input 84 of the second inverter 83 is connected to the output 82 of the first inverter 80. The output 85 of the second inverter 83 is connected to the output 3 of the circuit 1 for providing the POR-signal of the circuit 1.

The first current source 4 is implemented as a process sensitive current source 40 comprising a primary current source 41 implemented as first PMOS transistor, a secondary current source 42 implemented as first NMOS transistor, and a process sensitive resistor (PSR) 49 comprising a resistive block 43 connected in series with a second NMOS transistor 44. First PMOS transistor 41 has its source connected to the power supply line $V_{DD}$ and its drain connected to a first terminal of the PSR 43. First NMOS transistor 42 has its source connected to ground and its drain connected to the input 81 of the first inverter 80. Second NMOS transistor 44 has its source connected to ground and its drain connected to a second terminal of the resistive block 43. The gates of NMOS transistors 42 and 44 are connected together and to the drain of second NMOS transistor 44, such as to form a current mirror configuration. Herein, the secondary current source 42 delivers a current $I_M$ that is proportional to the current $I_P$ in the second NMOS transistor 44 according to $I_M=\alpha I_P$, $\alpha$ being the current gain of the current mirror constituted by the NMOS transistors 42 and 44; in the circuit as shown, $\alpha=2$.

In this embodiment, the current comparing function of the comparator 10 is provided by the fact that the first current source 4 generates a current $I_M$ of opposite sign with respect to the currents $I_{ref1}$ and $I_{ref2}$, while further these three currents are fed to one node. The transistors 50, 60 and 42 in combination constitute a current comparator with voltage output; said one node is the input 81 of inverter 80.

PMOS transistors 41, 50 and 60 have their respective gates coupled in common to receive a bias voltage $V_{bias}$ from a bias voltage source not illustrated in the drawing. For instance, the bias voltage source can be provided by a current reference circuit, or any other suitable reference source for providing a constant voltage $V_{bias}$.

When $V_{DD}$ is zero or starts to rise from zero, the PMOS transistors 41, 50 and 60 are OFF. When $V_{DD}$ has risen above $V_{bias}$, the PMOS transistors 41, 50 and 60 are switched ON. Herein, the PMOS transistors 50 and 60 are acting as constant current sources, providing respective currents $I_{ref1}$ and $I_{ref2}$. Similarly, PMOS transistor 41 acts as current source, generating a current $I_p$ the magnitude of which being, however, not constant but depends on $V_{DD}$ in view of the PSR 49 connected in series with PMOS transistor 41. PSR 49 has a monotonic current-voltage characteristic: the larger the voltage drop over PSR 49, the larger the magnitude of the currect flowing through it. As long as $V_{DD}$ is relatively low, the primary current $I_p$ from transistor 41 will be relatively low. Consequently, monitoring current $I_M$ will be relatively low, i.e. smaller than $I_{ref1}+I_{ref2}$, hence the output of the first inverter 80 will be LOW, and the POR output will be HIGH.

When $V_{DD}$ rises, the primary current $I_p$ will increase, as will the monitoring current $I_M$, whereas $I_{ref1}$ and $I_{ref2}$ will, at least substantially, remain constant.

At a certain value of $V_{DD}$, the monitoring current $I_M$ will be equal to $I_{ref1}+I_{ref2}$; this certain value of $V_{DD}$ will be indicated as "switching level". When $V_{DD}$ rises further, the magnitude of the monitoring current $I_M$ becomes larger than the magnitude of $I_{ref1}+I_{ref2}$, and the POR output switches to LOW.

Since the impedance of the resistive block 43 of the PSR 49 depends on the manufacturing process, the voltage drop over the resistive block 43 of the PSR 49 also depends on the manufacturing process. Therefore, the voltage at the gate of first NMOS transistor 42 depends on the process. Consequently, the exact magnitude of the monitoring current $I_M$ generated by first NMOS transistor 42 depends on the manufacturing process.

As indicated earlier, the POR output signal may be applied to other circuitry, indicated hereinafter as "target circuitry", for inhibiting the functioning thereof during power-up. The POR output signal may also be applied to other circuitry as a reset signal. Such target circuitry will have a certain Reset Threshold Level RTL. The present circuit will be designed in such a way, that the switching level thereof corresponds to RTL of the target circuitry, i.e. the POR output switches from HIGH to LOW when $V_{DD}$ reaches RTL.

When manufacturing integrated circuits on a wafer, the transistors within one IC will only have an insignificant parameter spread whereas the transistors in different ICs may have a relatively large parameter spread. This means that in some ICs, the transistors may have a relatively low RTL, whereas in other ICs, the transistors may have a relatively high RTL. Now, it is advantageous to have the POR circuit of the present invention implemented on the same chip. Then, in an IC with a relatively low RTL, the PSR 49 will already "allow" a certain current $I_P$ to flow at a relatively low value of $V_{DD}$. Similarly, in an IC with a relatively high RTL, the PSR 49 will "need" a relatively high value of $V_{DD}$ for the same magnitude of primary current $I_P$. In other words, the POR switching level is automatically and individually adapted to the RTL of the target circuitry.

Figure 3A:
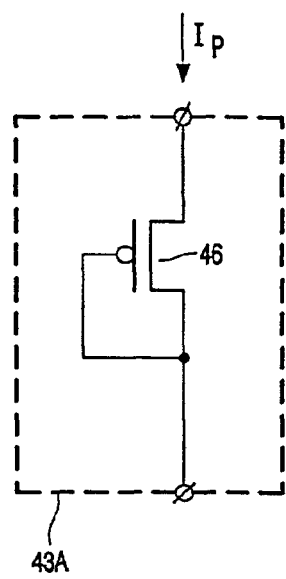
FIGS. 3A–B show embodiments of a process sensitive resistor for use in an adaptive POR circuit according to the present invention.
Figure 3B:
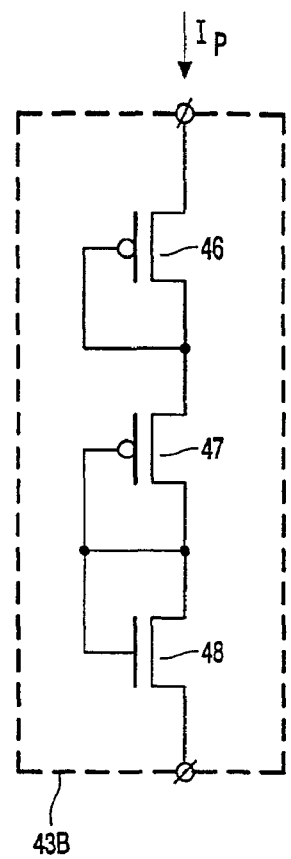

Examples of embodiments of the resistive block 43 of the PSR 49 are shown in FIGS. 3A and 3B. In the embodiment of FIG. 3A, a resistive block 43A is implemented by a fifth PMOS transistor 46 having its gate terminal connected to its drain terminal and to the drain terminal of the second NMOS transistor 44. The source terminal of PMOS transistor 46 functions as input terminal for receiving the output current $I_P$ of the first PMOS transistor 41.

In the embodiment of FIG. 3B, a resistive block 43B comprises the fifth PMOS transistor 46 as described above, and a combination of two cascaded transistors, i.e. PMOS transistor 47 and NMOS transistor 48, connected in series between the fifth PMOS transistor 46 and the second NMOS transistor 44. Transistor 47 has its source terminal connected to the drain terminal of transistor 46. Transistor 48 has its source terminal connected to the drain terminal of transistor 44. Transistor 48 has its drain terminal connected to the drain terminal of transistor 47, and the gate terminals of transistors 47 and 48 are connected to this node.

It is possible to have two or more of such combinations of cascaded transistors coupled in series between transistors 46 and 45. Thus, is easily possible to select a suitable switching threshold.

It should be clear to a person skilled in the art that the scope of the present invention is not limited to the examples discussed in the above, but that several amendments and modifications are possible without departing from the scope of the invention as defined in the appending claims.

For instance, other types of configuration may implement the PSR 49. Also, any suitable type of switch can implement the controllable switch 7. The switch may be of a type that is to be controlled by the output of the second inverter 83.

Further, a current mirror may be implemented by other means than the two transistors 42, 44.

If the circuit is used to monitor a voltage different from the supply voltage, it may be desirable to use a level shifter to deliver proper logic levels because the voltage to be monitored is generally lower than supply voltage.

Further, it is not necessary for the three PMOS transistors 41, 50 and 60 to have their gates biased by the same bias voltage, although such is preferred.

Figure 4:
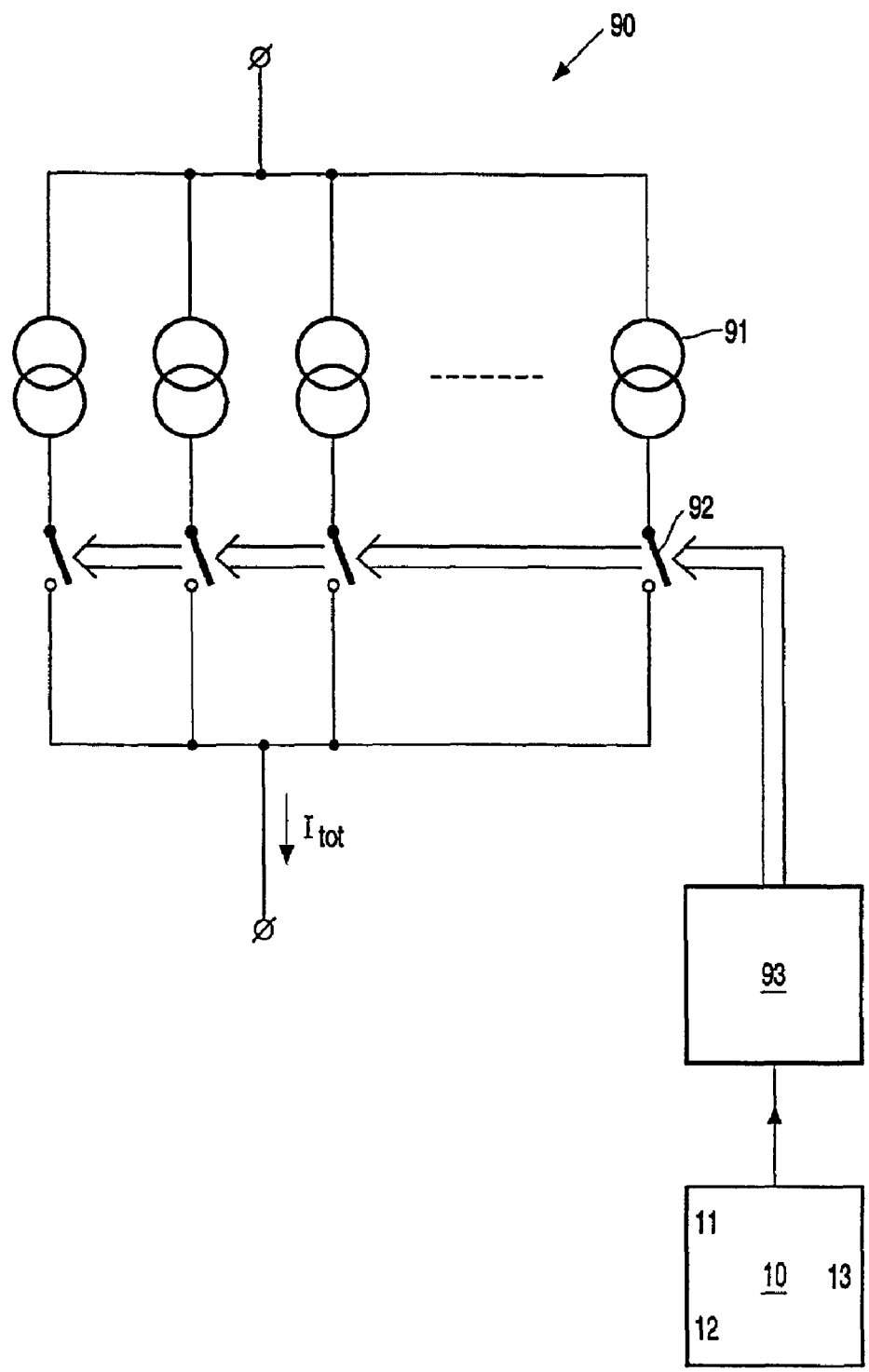
FIG. 4 shows schematically a programmable current source.

In the foregoing, the invention is described in relation to three fixed current sources 4, 5 and 6. Herein, the second current source 5 generates a first reference current $I_{ref1}$ which determines the switching level of the circuit and which is, in principle, constant, while the third current source 6 generates a second reference current $I_{ref2}$ which determines the hysteresis of the circuit and which is also, in principle, constant. As an alternative, any of the said current sources can be implemented as programmable current source. FIG. 4 shows schematically a possible embodiment for such programmable current source 90, comprising a plurality of N series combinations of a fixed current source 91 and a controllable switch 92 connected in parallel. The controllable switches $92_i$ (i=1 . . . N) are controlled by a control unit 93, which receives an output signal from the current comparator 10 as input signal. The control unit can be implemented in any known per se manner. The control unit can be adapted after manufacture, in order to establish which of the controllable switches $92_i$ are actually controlled by the control unit 93 and which are not. As a consequence, the magnitude of the current generated by the programmable current source 90 in response to the output signal from the current comparator 10 can be set after manufacture.

When the third current source 6 is implemented as such a programmable current source, the hysteresis of the circuit can be set after manufacture.

When the second current source 5 is implemented as such a programmable current source, the switching level of the circuit can be set after manufacture. The scope of protection of the invention is not limited to the examples given herein. The invention is embodied in each novel characteristic and each combination of characteristics. Referance numerals in the claims do not limit the scope of protection thereof. The use of the term "comprising" does not exclude the presence of elements other than those mentioned in the claims. The use of the word "a" or "an" before an element does not exclude the presence of a plurality of such elements.

What is claimed is:

1. A voltage level monitoring circuit, comprising:
   a first reference current source (5) for generating a first reference current ($I_{ref1}$) and comprising a transistor (50);
   a second reference current source (6) for generating a second reference current ($I_{ref2}$);
   a controllable switch (7);
   a monitoring current source (4) for generating a monitoring current ($I_M$) derived from a voltage ($V_M$) to be measured, the monitoring current source including:
   a primary current source (41) for generating a primary current ($I_P$) said transistor (50) having a control terminal connected to a control terminal of said primary current source (41), a first terminal connected directly to a first terminal of said primary current source (41), and a second terminal coupled to a first current input (11),
   a secondary current source (42) for generating the monitoring current($I_M$), and
   a process sensitive resistor (49) connected in series with the primary current source (41); and
   a comparator device (10) including
      said first current input (11) being coupled for receiving the first reference current ($I_{ref1}$) in response to the controllable switch (7) being non-conductive, and for receiving both the first reference current ($I_{ref1}$) and second reference current ($I_{ref2}$) in response to the controllable switch (7) being conductive,
      a second current input (12) coupled for receiving the monitoring current ($I_M$), and
      at least one measuring signal output (13),
      wherein the comparator device (10) is arranged for comparing the currents received at its two current inputs (11, 12) and for generating at the measuring signal output (13) a measuring signal (S) with a first value when the current received at its second current input (12) is less than the current received at its first current input (11), and with a second value when the current received at its second current input (12) is more than the current received at its first current input (11).

2. The voltage level monitoring circuit according to claim 1, wherein the first reference current source (5) includes said transistor (50) being a PMOS transistor (50) having its source coupled for receiving the voltage ($V_{DD}$) to be measured, having its gate coupled for receiving a bias voltage ($V_{bias}$), and having its drain coupled to the first current input (11) of the comparator device (10).

3. The voltage level monitoring circuit according to claim 1, wherein a current output of the second reference current source (6) is coupled to the comparator device (10) through the controllable switch (7).

4. The voltage level monitoring circuit according to claim 1, wherein the controllable switch (7) is controlled by a control signal (Sc) generated by the comparator device (10).

5. The voltage level monitoring circuit according to claim 4, wherein the control signal (Sc) renders the controllable switch (7) conductive when a magnitude of the current received at the first input (11) of the comparator device (10) is higher than a magnitude of the current received at the second input (12) of the comparator device (10), and renders the controllable switch (7) non-conductive when the magnitude of the current received at the first input (11) of the comparator device (10) is lower than the magnitude of the current received at the second input (12) of the comparator device (10).

6. The voltage level monitoring circuit according to claim 1, wherein the second reference current source (6) includes a PMOS transistor (60) having its source coupled for receiving the voltage ($V_{DD}$) to be measured, having its gate coupled for receiving a bias voltage ($V_{bias}$), and having its drain coupled to the controllable switch (7).

7. The voltage level monitoring circuit according to claim 1, wherein the controllable switch (7) includes a PMOS transistor (70) having its source coupled the current output of the second reference current source (6), having its drain coupled to the first current input (11) of the comparator device (10), and having its gate coupled to a control output (14) of the comparator device (10).

8. The voltage level monitoring circuit according to claim 7, wherein the comparator device (10) includes:
   a first inverter (80) having an input (81) and an output (82); and
   a second inverter (83) having an input (84) and an output (85),
   wherein the output (85) of the second inverter (83) is connected to the output (13) of the comparator device (10), the input (84) of the second inverter (83) is coupled to the output (82) of the first inverter (80), and the input (81) of the first inverter (80) is coupled to both the first and second current inputs (11; 12) of the comparator device (10).

9. The voltage level monitoring circuit according to claim 8, wherein the output (82) of the first inverter (80) is coupled to the control output (14) of the comparator device (10).

10. The voltage level monitoring circuit according to claim 1, wherein the primary current source (41) includes a PMOS transistor having its source connected to the voltage ($V_{DD}$) to be monitored, having its gate coupled for receiving a bias voltage ($V_{bias}$), and having its drain connected to a first terminal of the process sensitive resistor (49).

11. The voltage level monitoring circuit according to claim 1, wherein the secondary current source (42) includes:
   a first NMOS transistor having its source connected to ground and its drain coupled to the second current input (12) of the comparator device (10); and a second NMOS transistor (44) having its source connected to ground and its drain connected to a resistive block (43) of the process sensitive resistor (49), wherein gates of the first and second NMOS transistors (42; 44) are connected together and to the drain of the second NMOS transistor (44).

12. The voltage level monitoring circuit according to claim 1, wherein the process sensitive resistor (49) includes a further PMOS transistor (46) having its gate terminal connected to its drain terminal in a gate/drain node and having its source terminal coupled to the current output of the primary current source (41) for receiving the primary current ($I_p$).

13. The voltage level monitoring circuit according to the process sensitive resistor (49) circuit according to claim 12, the process sensitive resistor (49) further includes at least one combination of two cascaded transistors (PMOS 47, NMOS 48) connected in series with said gate/drain node, a first one of said cascaded transistors (47) having its source terminal coupled to the drain terminal of the further PMOS transistor (46), a second one of said cascaded transistors (48) having its drain terminal connected to the drain terminal of said first one of said cascaded transistors (47), and gate terminals of said cascaded transistors (47, 48) being connected to each other and to the respective drain terminals of said cascaded transistors (47, 48).

14. The voltage level monitoring circuit according to claim 1, wherein the monitoring current source (4) includes a programmable current source (90).

15. The voltage level monitoring circuit according to claim 1, wherein the first reference current source (5) includes a programmable current source (90).

16. The voltage level monitoring circuit according to claim 1, wherein the second reference current source (6) includes a programmable current source (90).

17. A voltage level monitoring circuit, comprising:
a first reference current source (5) for generating a first reference current ($I_{ref1}$) and comprising a transistor (50);
a second reference current source (6) for generating a second reference current ($I_{ref2}$);
a monitoring current source (4) for generating a monitoring current ($I_M$) derived from a voltage ($V_M$) to be measured, the monitoring current source including:
a primary current source (41) for generating a primary current ($I_p$) said transistor (50) having a control terminal connected to a control terminal of said primary current source (41), a first terminal connected directly to a first terminal of said primary current source (41), and a second terminal coupled to a first current input (11),
a secondary current source (42) for generating the monitoring current($I_M$), and
a process sensitive resistor (49) connected in series with the primary current source (41); and
a comparator device (10) including a first current input (11) coupled for receiving the first reference current ($I_{ref1}$), a second current input (12) coupled for receiving the monitoring current ($I_M$), and at least one measuring signal output (13),
wherein the first current input (11) is coupled for receiving the second reference current ($I_{ref2}$) through a controllable switch (7) controlled by a control signal (Sc) generated by the comparator device (10), and wherein the comparator device (10) is arranged for comparing the currents received at its two current inputs (11, 12) and for generating at the measuring signal output (13) a measuring signal (S) with a first value when the current received at its second current input (12) is less than the current received at its first current input (11), and with a second value when the current received at its second current input (12) is more than the current received at its first current input (11).

18. A voltage level monitoring circuit, comprising:
a first reference current source (5) for generating a first reference current ($I_{ref1}$);
a second reference current source (6) for generating a second reference current ($I_{ref2}$);
a monitoring current source (4) for generating a monitoring current ($I_M$) derived from a voltage ($V_M$) to be measured, the monitoring current source including:
a primary current source (41) for generating a primary current ($I_p$),
a secondary current source (42) for generating the monitoring current ($I_M$), and
a process sensitive resistor (49) connected in series with the primary current source (41); and
a comparator device (10) including
a first current input (11) coupled for receiving the first reference current ($I_{ref1}$),
a second current input (12) coupled for receiving the monitoring current ($I_M$),
a control output (14),
a first inverter (80) having an input (81) coupled to the first current input (11) and the second current input (12), the first inverter (80) further having an output (82) coupled to the control output (14),
a second inverter (83) having an input (84) coupled to the output (82) of the first inverter (80), the second inverter (83) further having an output (85), and
at least one measuring signal output (13) coupled to the output (85) of the second inverter (85),
wherein the first current input (11) is coupled for receiving the second reference current ($I_{ref2}$) through a controllable switch (7) controlled by a control signal (Sc) generated at the control output (14), and
wherein the comparator device (10) is arranged for comparing the currents received at its two current inputs (11, 12) and for generating a measuring signal (S) having a first value when the current received at its second current input (12) is less than the current received at its first current input (11), and with a second value when the current received at its second current input (12) is more than the current received at its first current input (11).

19. The voltage level monitoring circuit according to claim 17, wherein the control signal (Sc) renders the controllable switch (7) conductive when a magnitude of the current received at the first input (11) of the comparator device (10) is higher than a magnitude of the current received at the second input (12) of the comparator device (10), and renders the controllable switch (7) non-conductive when the magnitude of the current received at the first input (11) of the comparator device (10) is lower than the magnitude of the current received at the second input (12) of the comparator device (10).

20. The voltage level monitoring circuit according to claim 18, wherein the control signal (Sc) renders the controllable switch (7) conductive when a magnitude of the current received at the first input (11) of the comparator device (10) is higher than a magnitude of the current received at the second input (12) of the comparator device (10), and renders the controllable switch (7) non-conductive when the magnitude of the current received at the first input (11) of the comparator device (10) is lower than the magnitude of the current received at the second input (12) of the comparator device (10).

21. The voltage level monitoring circuit according to claim 1, wherein said second reference current source (6) and said switch (7) are electrically connected in series in response to said switch (7) being conductive; and wherein said first reference current source (5) is electrically connected in parallel to said series connection of said second reference current source (6) and said switch (7) in response to said switch (7) being conductive.

22. The voltage level monitoring circuit according to claim 17, wherein said second reference current source (6) and said switch (7) are electrically connected in series in response to said switch (7) being conductive; and wherein said first reference current source (5) is electrically connected in parallel to said series connection of said second reference current source (6) and said switch (7) in response to said switch (7) being conductive.

23. The voltage level monitoring circuit according to claim 18, wherein said second reference current source (6) and said switch (7) are electrically connected in series in response to said switch (7) being conductive; and wherein said first reference current source (5) is electrically connected in parallel to said series connection of said second reference current source (6) and said switch (7) in response to said switch (7) being conductive.

* * * * *